United States Patent [19]
Quint

[11] Patent Number: 5,336,924
[45] Date of Patent: Aug. 9, 1994

[54] ZENER DIODE HAVING A REFERENCE DIODE AND A PROTECTIVE DIODE

[75] Inventor: Johannes H. M. M. Quint, Nijmegen, Netherlands

[73] Assignee: U.S. Philips Corporation, New York, N.Y.

[21] Appl. No.: 989,630

[22] Filed: Dec. 14, 1992

[30] Foreign Application Priority Data

Dec. 16, 1991 [EP] European Pat. Off. ......... 91203310.7

[51] Int. Cl.$^5$ ............................................. H01L 29/90
[52] U.S. Cl. ................................... 257/603; 257/199; 257/605; 257/606
[58] Field of Search ............... 257/199, 603, 605, 606, 257/347

[56] References Cited

U.S. PATENT DOCUMENTS

| | | | |
|---|---|---|---|
| 4,419,681 | 12/1983 | Schmitz | 257/606 |
| 4,429,324 | 1/1984 | Wilkens | 257/606 |
| 4,484,206 | 11/1984 | Moroshima et al. | 257/606 |
| 4,672,403 | 6/1987 | Jennings | 257/606 |
| 4,732,866 | 3/1988 | Chruma et al. | 257/606 |
| 4,771,011 | 9/1988 | Hemmah et al. | 257/606 |
| 4,999,683 | 3/1991 | Kiyomura et al. | 257/606 |
| 5,001,335 | 3/1991 | Takaoka et al. | 257/605 |

FOREIGN PATENT DOCUMENTS

| | | | |
|---|---|---|---|
| 2501914 | 9/1982 | France. | |
| 0112779 | 5/1989 | Japan | 257/606 |
| 2113907 | 8/1983 | United Kingdom | 257/606 |

*Primary Examiner*—Rolf Hille
*Assistant Examiner*—David Ostrowski
*Attorney, Agent, or Firm*—Steven R. Biren

[57] ABSTRACT

A zener diode having a semiconductor body (1) with a surface zone (1') doped with more than $10^{18}$ atoms/cc, in which at least two regions (2, 3) are provided through diffusion, which regions have substantially the same concentration of doping atoms and adjoin a surface (4) of the surface zone (1') and form p-n junctions (5,6) with the surface zone (1'), a first region (2) having a smaller lateral cross-section and a smaller depth than a second region (3). Both regions (2, 3) are connected to a first connection electrode (7, 8) provided on the surface (4), and a second connection electrode (9), which is spaced apart from the regions (2, 3), is provided on the semiconductor body (1). The first region has a side edge (10) which is formed through lateral diffusion and which is at least partly spaced apart from the second region (3). A higher electric field is created locally in the junction (5) during operation of the zener diode owing to the side edge (10). The current voltage characteristic of the zener diode is steeper as a result of this.

7 Claims, 2 Drawing Sheets

ZENER DIODE HAVING A REFERENCE DIODE AND A PROTECTIVE DIODE

BACKGROUND OF THE INVENTION

The invention relates to a zener diode having a semiconductor body with a surface zone doped with more than $10^{18}$ atoms/cc in which at least two regions are provided through diffusion with substantially the same concentration of doping atoms, which regions adjoin a surface of the surface zone and form p-n junctions with the surface zone, a first region having a smaller lateral cross-section and a smaller depth than a second region and both regions being connected to a first connection electrode provided on the surface, while a second connection electrode, which is spaced apart from regions, is provided on the semiconductor body.

A zener diode as described above has a comparatively low zener voltage of below approximately 10 V because of the comparatively high concentration of doping atoms of the surface zone. The smaller diode formed by the first region, which is also called the reference diode, has a lower zener voltage than the larger diode formed by the second region and called the protective diode. In a practical embodiment, the first region has a cross-section of, for example, 1000 $\mu m^2$ and a depth of 1 $\mu m$, whereas the second region has a cross-section of 10000 $\mu m^2$ and a depth of 1.5 $\mu m$. At a comparatively small current of, for example, 250 $\mu A$ through the zener diode, the reference diode alone will conduct. At higher currents of, for example, 100 mA the current flows substantially entirely through the protective diode. Since the reference diode has a comparatively small cross-section, the current density through this diode is comparatively great at a current of 250 $\mu A$. As a result, the zener diode has a comparatively steep current-voltage characteristic at this low current of 250 $\mu A$.

French Patent Application no. 81 05 132 discloses a zener diode of the kind mentioned in the opening paragraph in which an annular second region surrounds a disc-shaped first region, while the regions overlap partly. The second region is formed from a highly doped polycrystalline silicon layer in the shape of a ring by means of a comparatively deep diffusion. The first region is formed in that a second highly doped epitaxial silicon layer is provided, overlapping the polycrystalline layer, upon which the first region is formed through shallow diffusion.

Although the known zener diode described has a current-voltage characteristic which is much steeper than that of a standard zener diode, the steepness of the current-voltage characteristic is not sufficient for some applications.

SUMMARY OF THE INVENTION

It is among the objects of the invention to provide a zener diode which has a current-voltage characteristic which is steeper than that of the known zener diode.

According to the invention, the device is for this purpose characterized in that the first region has an edge formed by lateral diffusion which lies at least partly spaced apart from the second region.

It is achieved by this that the current-voltage characteristic is steeper than that of the known zener diode.

A zener diode can conduct current through breakdown of a space charge region at a p-n junction. This breakdown may take place by two mechanisms which are known per se, i.e. zener breakdown, also called tunnelling, and avalanche breakdown. Avalanche breakdown only is of importance in the case of zener diodes having a zener voltage above approximately 10 V. With zener voltages below 10 V, both the avalanche and the zener mechanism are applicable. When zener breakdown takes place, the current voltage characteristic is not very steep. The current-voltage characteristic is steep in the case of the avalanche breakdown. Avalanche breakdown is initiated when a critical electric field strength in the space charge region is exceeded. Since the edge of the first region formed by lateral diffusion lies at least partly clear of the second region, a curvature in the junction of the reference diode is created. As a result, the electric field becomes stronger locally in the curve, so that the critical electric field for avalanche breakdown is reached sooner and breakdown of the zener diode takes place by the avalanche rather than by the zener mechanism. The current-voltage characteristic of the zener diode will accordingly be steeper.

An edge which lies at least partly clear of the second region may be provided in that, for example, the first and the second region are completely separated from one another. Such a zener diode may be manufactured in a very simple manner in that, for example, the two regions are provided by different diffusions through different openings in an oxide layer which are spaced apart sufficiently far. A disadvantage, however, is that an increase in leakage currents through the zener diode can occur between the regions through injection of charge carriers into the oxide, which can affect the current-voltage characteristic of the zener diode. Preferably, the zener diode has a second region which surrounds and partly overlaps the first region, characterized in that a depression, below which the first region is situated, is present in the surface to such a depth that the side edge projects to below the second region. Problems involving leakage currents do not occur owing to the partial overlap of the two regions, while the projection of the edge of the first region to below the second region results in a curvature in the junction of the reference diode. Such a depression can be very simply; manufactured in an etching step. The first region may then be diffused from a highly doped layer which is provided in the depression. The p-n junction has a curvature at the edge of the depression, so that the electric field required for initiating the avalanche breakdown is reached sooner here.

Preferably, the depression has a depth of between 0.5 and 2 microns, the first region a depth of between 0.5 and 1.5 microns, and the second region a depth of between 1.5 and 3 microns. The zener voltage of the protective diode must obviously be higher than that of the reference diode for a good operation of the zener diode, i.e. the depth of the second region must be greater than the depth of the first region. Such a depth of the depression can be made well reproducibly in an etching process, while the depth of the first and second region are such that the first and second region can be manufactured to a sufficient accuracy in a diffusion process without excessively long diffusion times.

An extra advantage is obtained when the lateral cross-section of the first region has angles. The junction is then compared with a circular cross-section of approximately the same dimensions, which is locally additionally curved at the area of the angle, so that the electric field will increase there and breakdown of the reference diode will take place preferably by the avalanche mechanism. A regular polygon has the advantage that a similar increase in the electric field is obtained at every angle, so that the junction will not break down sooner at one of the angles than at the others. In the case of cross-sections of regular polygons having more than four angles, the angle is so great that the effect on the curvature of the p-n junction compared with a circle is comparatively small. An additional advantage is obtained when the cross-section is a regular triangle or quadrangle. The angle is smaller than or equal to 90° in the case of triangles or quadrangles, sufficient for achieving a clear additional curvature of the p-n junction. In practice, the angles will have a certain radius of curvature, preferably a radius of curvature of between 0 and 5 micrometres. The angle is sufficiently sharp then for obtaining a clear curvature of the p-n junction in practice.

The first connection electrode of the zener diode may be manufactured from a metal layer, or partly from an epitaxial highly doped silicon layer, as in the known zener diode. Preferably, the zener diode is characterized in that a highly doped polysilicon layer is provided over the first and the second region, which layer functions as the first connection electrode. Such a polycrystalline silicon layer may be provided more simply than an epitaxial layer by a CVD process with a high concentration of doping atoms. This polysilicon layer is used as a highly doped source for diffusion of the regions during the manufacture of the zener diode.

BRIEF DESCRIPTION OF THE DRAWING

The invention will be explained in more detail below by way of example with reference to drawing and an embodiment. In the drawings.

The Figures are purely diagrammatic and not drawn to scale. Corresponding parts are generally denoted with the same reference numerals in the Figures.

DESCRIPTION OF THE PREFERRED EMBODIMENTS

Figure 1:
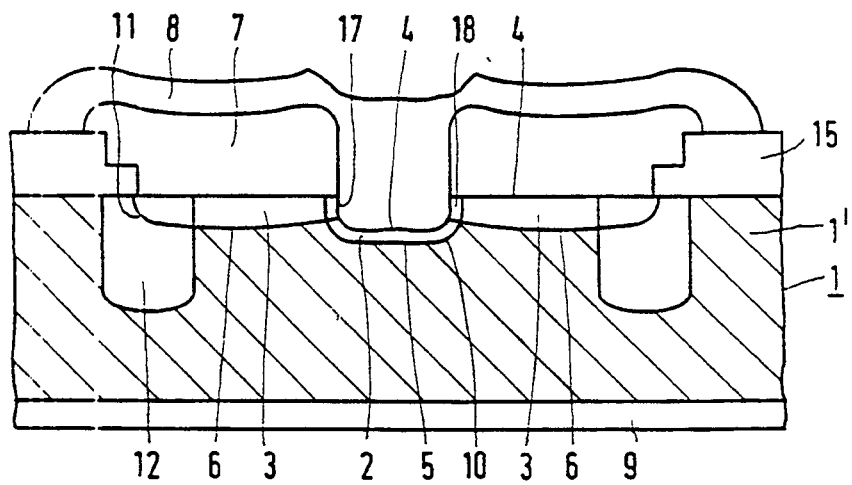
FIG. 1 is a cross-section of a zener diode according to the invention.

FIG. 1 shows a zener diode with a semiconductor body 1 having a surface zone 1' doped with more than $10^{18}$ atoms/cc, in which at least two regions 2, 3 are provided by diffusion with substantially the same concentration of doping atoms, which regions adjoin a surface 4 of the surface zone 1' and form p-n junctions 5, 6 with the surface zone 1', a first region 2 having a smaller lateral cross-section and a smaller depth than a second region 3, while both regions 2, 3 are connected to a first connection electrode 7, 8 provided on the surface 4, and a second connection electrode 9 which is spaced apart from the regions 2 and 3 is provided on the semiconductor body 1.

Zener diodes are mainly used for supplying a reference voltage in electric circuits. It is important for this purpose that a current-voltage characteristic belonging to the zener diode is very steep. A great steepness is not easy to realize, especially for zener diodes having zener voltages below approximately 10 V. Owing to the comparatively high concentration of doping atoms in the surface zone 1', the zener diode described above forms a zener diode for comparatively low zener voltages below approximately 10 V. The zener voltage of the p-n junctions 5 and 6 increases with an increasing depth of the regions 2 and 3 in the regions 2 and 3 provided by diffusion and having substantially the same concentration of doping atoms, while the lateral cross-section of each region influences the current density. The current density will be higher with smaller lateral cross-sections. The higher the current density, the steeper the current-voltage characteristic of the zener diode. The zener diode of FIG. 1 comprises two p-n junctions 5 and 6 connected in parallel, which act as two auxiliary zener diodes. When there is a comparatively small current of, for example, approximately 250 µA through the zener diode, the first auxiliary zener diode only belonging to the p-n junction 5 with a comparatively small lateral cross-section of, for example, approximately 1000 µm² will conduct, so that a steep current-voltage characteristic is obtained. A reference voltage can be well defined by means of the zener diode with such a current-voltage characteristic. This first auxiliary zener diode, therefore is sometimes referred to as a reference diode. At higher currents, however, the reference diode may be destroyed by the high current density. Therefore, a second auxiliary zener diode belonging to the p-n junction 6 is provided, also called a protective diode. The protective diode has a somewhat higher zener voltage than the reference diode on account of the greater depth of the second region 3, for example, approximately 0.5 V higher. Now if the current through the reference diode increases, the voltage across the zener diode will also increase. The moment this voltage rises to above the zener voltage of the protective diode, this latter diode will also become conducting. The protective diode has a greater lateral cross-section, for example approximately 1000 µm², so that the protective diode will conduct more current than the reference diode with increasing current through the zener diode. At a high current of, for example, 100 mA, the current will flow practically entirely through the protective diode.

Although the zener diode described has a comparatively steep current-voltage characteristic, the steepness of the current-voltage characteristic is not sufficient for some applications. According to the invention, therefore, the first region 2 has a side edge 10 formed by lateral diffusion which lies at least partly clear of the second region 3.

Breakdown of zener diodes is influenced by two different physical phenomena: zener breakdown, which is also called tunnelling, and avalanche breakdown. In the case of zener breakdown, a high electric field transports an electron from a valency band to a conduction band via a tunnelling mechanism. In the case of avalanche breakdown, charge carriers in the form of electrons and holes are formed via a thermal mechanism. At a critical electric field strength in the space charge region, these charge carriers can absorb so much kinetic energy before colliding with a crystal lattice that new charge carriers are detached from the lattice upon the collision and in their turn again can detach more new charge carriers. An avalanche effect is thus created. Avalanche breakdown is the dominant factor in zener diodes having a threshold voltage above approximately 10 V. These diodes have a very steep current-voltage characteristic. Both zener and avalanche breakdown are important in zener diodes having a threshold voltage below approximately 10 V. The invention is based on the recognition that the presence of a side edge 10 formed by lateral diffusion at the first region 2, which lies at least partly clear of the second region 3, leads to a strong curvature of the p-n junction 5 locally near the side edge. The electric field becomes stronger there owing to this curvature. The critical electric field required for avalanche breakdown is then reached sooner than without the edge 10.

The zener diode of FIG. 1 is provided with guard rings 12 to prevent breakdown at an outer side edge 11 of the second region 3, i.e. regions 12 are present of the same conductivity type as the regions 2 and 3, but with a much greater depth than the latter regions. Breakdown at the outer side edge 11 is prevented by this.

Figure 2:
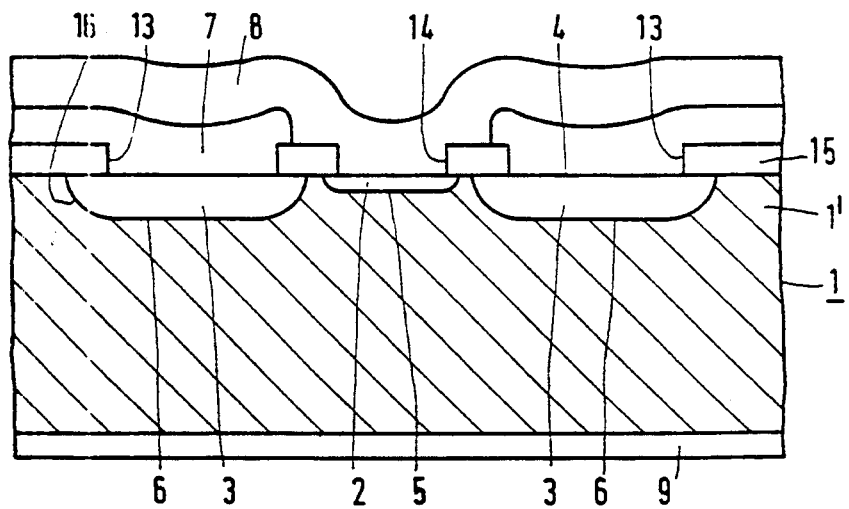
FIG. 2 is a cross-section of an alternative embodiment of the zener diode according to the invention.

FIG. 2 shows a zener diode with a side edge 10 of the first region 2 which lies clear of the second region 3 because the first region 2 and the second region 3 are fully separated from one another. Such a zener diode may be very readily manufactured in that, for example, the two regions 2, 3 are provided by different diffusions through different openings 13, 14 lying sufficiently fax apart in an oxide layer 15. During manufacture of the zener diode, for example, the opening 13 in the oxide layer 15 is then provided first, upon which a highly doped layer 7 is provided. The region 3 is formed from this layer 7 through a deep diffusion. Then the opening 14 is provided, upon which the highly doped layer 8 is provided. The region 2 is provided from this layer through a shallow diffusion. Because of the smaller depth of region 2, the side edge 10 then has a sharper curvature than does a side edge 16 of the second region 3. Breakdown of the zener diode will accordingly take place at the side edge 10 of the first p-n junction 5. A disadvantage of the zener diode of FIG. 2, however, is that an increase in leakage currents through the zener diode can occur between the regions 2 and 3 through the surface 4 owing to injection of charge careers into the oxide 15, which can influence the current-voltage characteristic of the zener diode. FIG. 1 shows that the zener diode according to the invention, therefore, has a second region 3 which surrounds and partly overlaps the first region, while a depression 17, below which the first region 2 lies, is present in the surface 4 to such a depth that the side edge 10 projects to below the second region 3. Problems with leakage currents do not occur owing to the partial overlap 18 of the two regions 2, 3, while the projection of the side edge 10 of the first region 2 to below the second region 3 leads to a curvature in the junction 5 of the reference diode, so that the critical electric field required for initiating an avalanche breakdown is reached sooner here.

Preferably, the depression has a depth of between 0.5 and 2 microns. A depression 17 can then be readily manufactured to a sufficient accuracy by means of, for example, a plasma etching step. According to the invention, the first region 2 has a depth of between 0.5 and 1.5 microns and the second region 3 a depth of between 1.5 and 3 microns. Such depths for regions 2 and 3 can still be achieved by means of a diffusion process within a limited time duration, shorter than approximately 2 hours. Obviously, the zener voltage of the protective diode must be higher than that of the reference diode for a good operation of the zener diode, i.e. the depth of the second region 3 must be greater than the depth of the first region 2. The depths of the first and second regions are such that the first and second region can be manufactured to a sufficient accuracy by a diffusion process.

Figure 3:
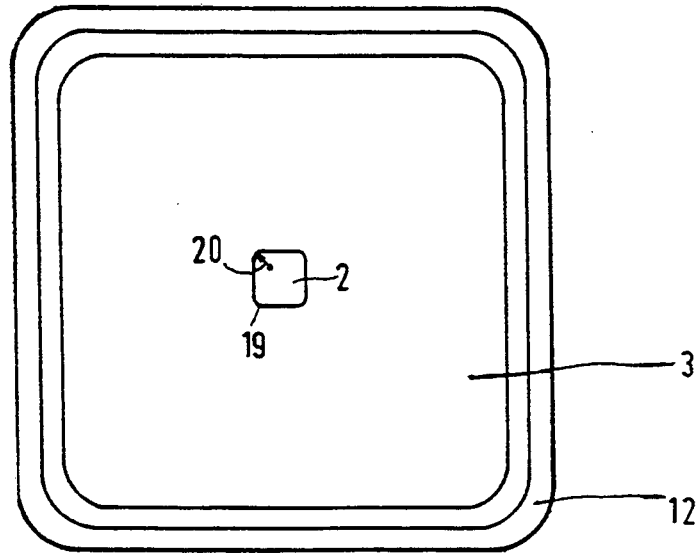
FIG. 3 is a plan view of a zener diode according to FIG. 1, and FIGS. 4, 5 show different stages in the manufacture of a zener diode according to FIG. 1.

FIG. 3 shows a lateral cross-section of the zener diode of FIG. 1. In practice, the region 3 has lateral dimensions of approximately one hundred to several hundreds of micrometers, while the region 2 has lateral dimensions of some tens of micrometers. According to the invention, the lateral cross-section of the first region 2 has angles 19. The junction 5 is then compared with a circular cross-section of the first region 2 having approximately the same dimensions, locally additionally curved at the area of the angle 19, so that the electric field will increase there and breakdown of the reference diode will take place mainly by the avalanche mechanism. In a regular polygon, the same increase in the electric field is found at each of the angles 19, so that the junction will not break down at one of the angles 19 in preference to another.. In the case of cross-sections of regular polygons having more than four angles, each angle is so great that the effect on the curvature of the p-n junction compared with a circle is comparatively small. An additional advantage is obtained when the cross-section is a regular triangle or quadrangle, where the angle 19 is smaller than or equal to 90°, sufficient for achieving a clear additional curvature of the p-n junction 5. In practice, the angles will have a certain radius of curvature 20, preferably a radius of curvature of between 0 and 5 micrometers. The angle 19 then is sharp enough for obtaining a clear curvature of the p-n junction 5.

The first connection electrode 7, 8 of the zener diode may be manufactured, for example, from a metal layer such as aluminium or silver. According to the invention, a highly doped (more than $10^{19}$ doping atoms/cc) polysilicon layer 7, 8 acting as the first connection electrode is provided over the first and the second region. The polycrystalline silicon layer 7, 8 may be provided simply through a CVD process with a high concentration of doping atoms, for example $1 \times 10^{20}$ atoms/cc. During the manufacture of the zener diode, this polysilicon layer 7, 8 is used as a highly doped source for diffusion of the regions 2 and 3. For example, a polysilicon layer 7 is then provided on the surface 4 and patterned in such a way that the layer 7 covers the surface 4 only there where the second region 3 is to be created. The second region 3 is then formed through a diffusion of doping atoms. The polysilicon layer 8 having the same concentration of doping atoms is then provided where the first region 2 is to be created, after which the first region 2 is formed by a diffusion of shorter duration or a diffusion at a lower temperature.

As an example of an embodiment, it will now be described how a zener diode suitable for a zener voltage of 5.4 V may be manufactured. Zener diodes suitable for other zener voltages may be manufactured through adaptation of the number of doping atoms in the surface zone of the semiconductor body and of the depths and doping levels of the regions 2 and 3.

Figure 4:
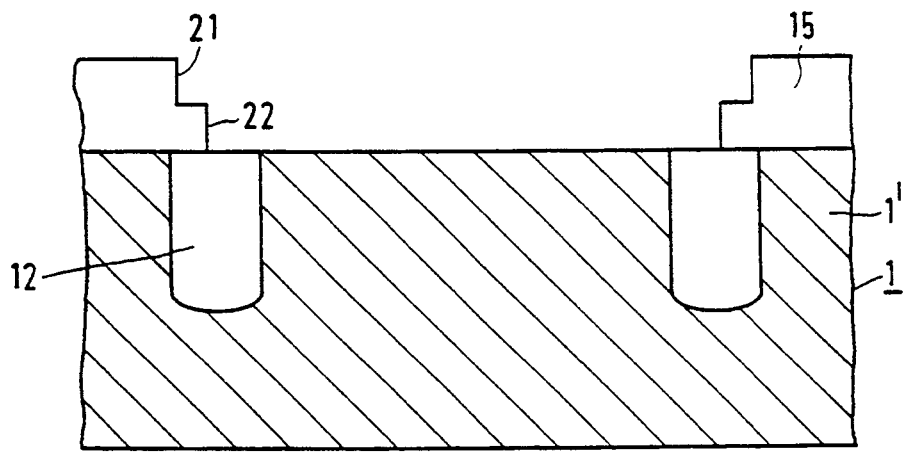
Figure 5:
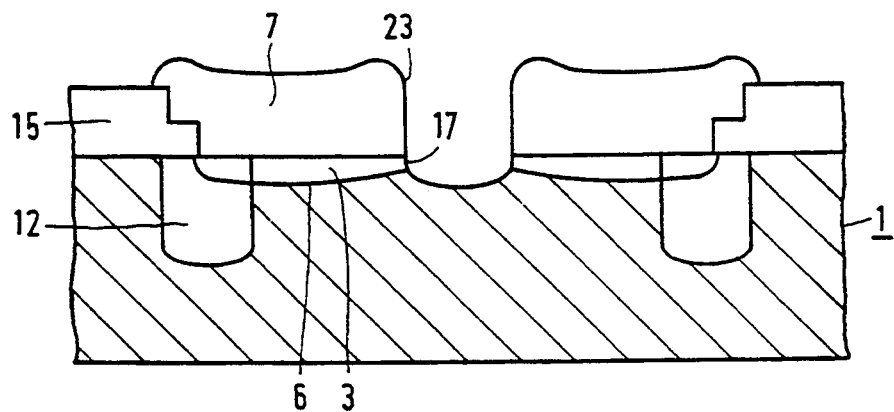

The starting point is a monocrystalline n-type silicon slice 1 with a concentration of $3 \times 10^{18}$ Sb doping atoms (12 m Ω cm). This slice 1 is thermally oxidized, 1100° C., 90 minutes, so that an oxide layer 15 is created. An opening 21 is provided in this oxide layer 15 for the diffusion of the guard ring 12. The guard ring 12 is provided in a standard process by means of, for example, implantation or diffusion. A guard ring 12 having a concentration of $7 \times 10^{19}$ atoms/cc and a depth of 5 $\mu$m is thus formed. During the diffusion of the guard ting 12, the opening 21 in the oxide layer 15 is partly oxidized again. Then an opening 22 having a diameter of 230 μm is made in the oxide layer 15 at the area where the first region 2 and the second region 3 are to be created (see FIG. 4). The polysilicon layer 7 is provided in the opening with a doping level of $1.25 \times 10^{20}$ B atoms/cc and a thickness of 1.6 μm. An opening 23 with a square lateral cross-section of $30 \times 30$ μm is now etched into the layer 7 by a plasma etching process at the area where the first region 2 is to come. The depression 17 is also provided in the semiconductor body 1 then to a depth of 1 μm. An oxide layer is provided in the depression 17. The second region 3 is subsequently formed through diffusion of B atoms from the layer 7 for 120 minutes at 950° C. The region 3 then has a depth of 1.5 μm. The p-n junction 6 belonging to the protective diode has thus been formed. The oxide layer in the depression protects the surface 4 in the depression 17 from undesirable doping during this diffusion. The oxide in the depression is then removed in an etching step. A diode as shown in FIG. 5 results. The second polysilicon layer 8 with the same doping level and thickness as the polysilicon layer 7 is now provided and patterned. The reference diode is provided in that B atoms are diffused from layer 8 for 30 minutes at 950° C. The depth of the first region is 1 μm then, with a lateral cross-section having a radius of curvature 20 of 5 μm. The polysilicon layers 7 and 8 serve not only as sources of doping atoms for making regions 2 and 3, but also as a connection electrode of the zener diode. The zener diode is then provided with a metallization on the connection electrode 7, 8 (not shown in FIG. 1) and with a connection electrode 9, for example a silver layer.

A zener diode manufactured in this way has a zener voltage of 5.40 V and a very steep current-voltage characteristic. The following parameters were measured, compared with a known zener diode. The impedance of the known zener diode at 250 μA is 91.7 Ω, that of the zener diode according to the invention 23.4 Ω. The voltage difference between a voltage at a current of 100 μA and a voltage at a current of 1 mA is 86.5 mV for the known zener diode against 9.0 mV for the zener diode according to the invention. The leakage current through the diode at a voltage which is 80% of the zener voltage is 2.23 μA for the known zener diode against 0.62 μA for the zener diode according to the invention.

I claim:

1. A zener diode having a semiconductor body with a surface zone doped with more than $10^{18}$ atoms/cc in which at least two regions are provided through diffusion with substantially the same concentration of doping atoms, which regions adjoin a surface of the surface zone and form p-n junctions with the surface zone, a first region having a smaller lateral cross-section and a smaller depth than a second region and both regions being connected to a first connection electrode provided on the surface, and a second connection electrode, spaced apart from the regions, on the semiconductor body, characterized in that the first region has a side edge formed by lateral diffusion which is at least partly spaced apart from the second region.

2. A zener diode as claimed in claim 1, in which the second region surrounds and partly overlaps the first region, characterized in that a depression, below which the first region is situated, is present in the surface to such a depth that the side edge projects to below the second region.

3. A zener diode as claimed in claim 2, characterized in that the depression has a depth of between 0.5 and 2 microns, the first region a depth of between 0.5 and 1.5 microns, and the second region a depth of between 1.5 and 3 microns.

4. A zener diode as claimed in claim 1, characterized in that the lateral cross-section of the first region has a polygonal shape.

5. A zener diode as claimed in claim 4, characterized in that the cross-section has the shape of one of a regular triangle and a quadrangle.

6. A zener diode as claimed in claim 4, characterized in that the polygonal shape has angles which have a radius of curvature of between 0 and 5 micrometers.

7. A zener diode as claimed in claim 1, characterized in that a highly doped polysilicon layer is provided over the first and the second region, which layer functions as the first connection electrode.

* * * * *